(12) United States Patent
Braun

(10) Patent No.: US 7,170,360 B2
(45) Date of Patent: Jan. 30, 2007

(54) DEVICE AND METHOD FOR DIGITAL PULSE WIDTH MODULATION

(75) Inventor: Christoph Braun, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/763,533

(22) Filed: Jan. 23, 2004

(65) Prior Publication Data
US 2004/0165661 A1    Aug. 26, 2004

(30) Foreign Application Priority Data
Jan. 31, 2003 (DE) ............... 103 03 919
Jun. 18, 2003 (DE) ............... 103 27 620

(51) Int. Cl.
*H03K 7/08* (2006.01)
(52) U.S. Cl. .................. 332/109; 375/238
(58) Field of Classification Search ............ 332/109; 375/238
See application file for complete search history.

(56) References Cited

U.S. PATENT DOCUMENTS

| 5,559,467 | A | 9/1996 | Smedley |
| 5,777,512 | A | 7/1998 | Tripathi et al. |
| 6,107,876 | A * | 8/2000 | O'Brien .................. 330/10 |
| 6,373,334 | B1 | 4/2002 | Melanson |
| 6,373,417 | B1 | 4/2002 | Melanson |
| 6,812,876 | B1 * | 11/2004 | Miller .................. 341/143 |
| 2003/0031245 | A1 | 2/2003 | O'Brien .................. 375/238 |
| 2004/0131193 | A1 * | 7/2004 | Kitamura .................. 381/28 |

FOREIGN PATENT DOCUMENTS

| DE | 19619208 | 11/1997 |
| DE | 10027164 A1 | 6/2001 |
| FR | 2 290 091 | 10/1975 |

OTHER PUBLICATIONS

Gourgue, F. et al., "A Bandpass Subsampled Delta-Sigma Modulator for Narrowband Cellular Mobile Communications," *Circuits and Systems,* 1994 ISCAS, Internat. Symposium, London, pp. 353-356.
Magrath A. J. et al., "Hybrid Pulse Width Modulation/Sigma-Delta Modulation Power Digital-to-Analogue Converter," *IEE Proc-Circuits Devices Systems,* vol. 143, No. 3, Jun. 1996, pp. 149-156.
Magrath et al., "Performance Enhancement of Sigma-Delta Modulator D-A Converters Using Non-Linear Techniques," *IEE Internat. Symp. Circuits and Systems,* ISCAS 1996, pp. 227-280.
Magrath A. J. et al., "Design and Implementation of a FPGA Sigma-Delta Power DAC," *Signal Processing Systems,* 1997, pp. 511-521.
International Search Report dated Jun. 1, 2004.

* cited by examiner

*Primary Examiner*—Joseph Chang
(74) *Attorney, Agent, or Firm*—Jenkins, Wilson, Taylor & Hunt, P.A.

(57) ABSTRACT

The present invention provides a device for digital pulse width modulation with: (a) a filter device (11) for filtering a filter input signal (10"); (b) a quantization device (13) for quantizing a filter output signal (11') of the filter device (11); (c) a PWM mapper device (15) for generating a digital PWM signal (15') from an output signal (13') of the quantization device (13); and (d) a feedback loop (17) for feeding back the digital PWM signal (15') to a loop input signal (10') and for generating the filter input signal (10") by subtraction. The present invention likewise provides a method for digital PWM.

14 Claims, 5 Drawing Sheets

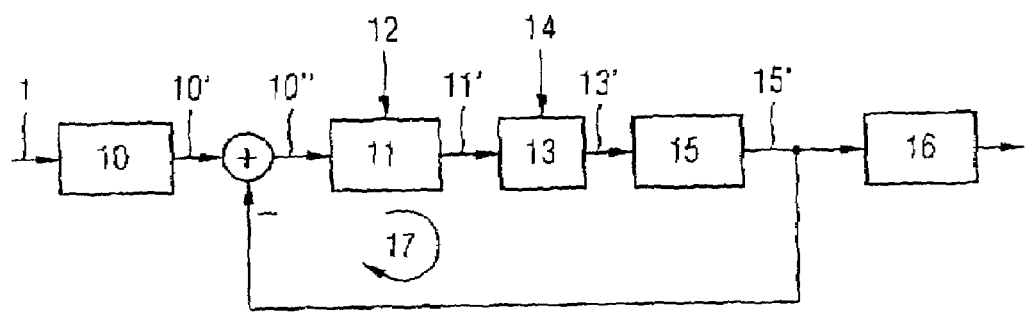
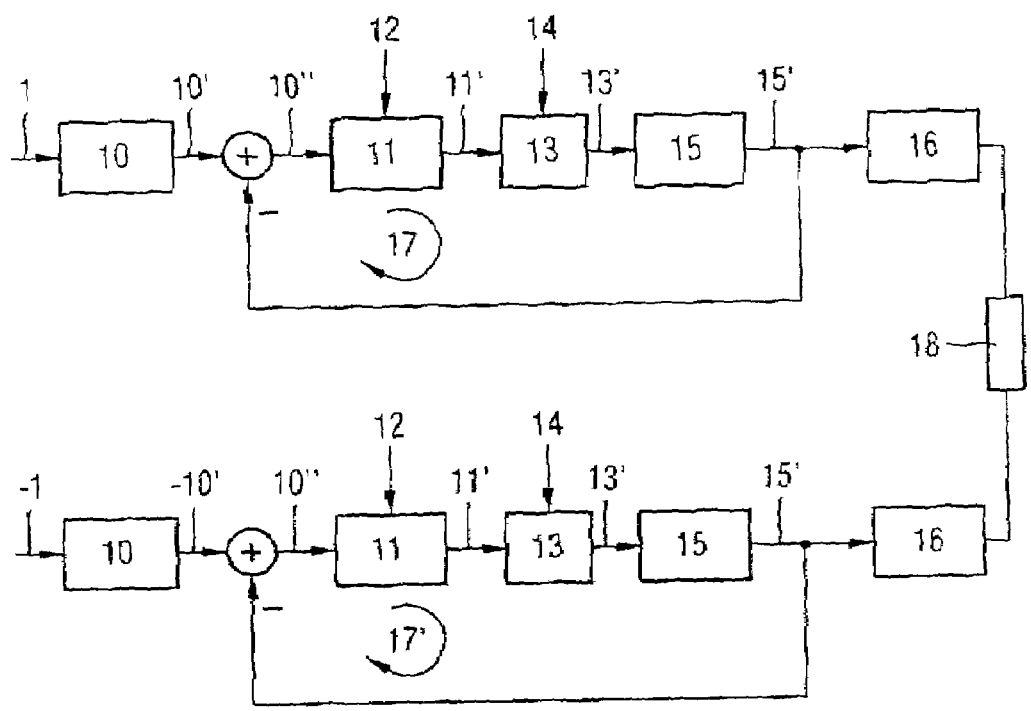

DEVICE AND METHOD FOR DIGITAL PULSE WIDTH MODULATION

TECHNICAL FIELD

The present invention relates to a device and a method for digital pulse width modulation, in particular a device and a method for the digital pulse width modulation of audio and video signals.

BACKGROUND ART

Digital pulse width modulators (PWM) are in widespread use in entertainment electronics and other areas. Existing digital pulse width modulators require a high time resolution of the pulse widths, which, for example in the audio range of 0 to 20 kHz, necessitates a clock frequency of approximately 100 MHz. According to Erick Bresch, Wayne T. Padgett, "TMS320C67-Based Design of a Digital Audio Power Amplifier Introducing Novel Feedback Strategy", relatively strong non-linear distortions occur in the case of high modulation in a digital PWM.

When sigma-delta modulation (SDM) is used, only a low clock frequency, of for example 2 to 4 MHz, is required for an audio signal, but the output signal then tends to be a pulse-density-modulated signal, which is unsuitable for example for a Class-D amplification on account of the signal-dependent pulse density, since, in the case of pulses that are not ideal, this leads to non-linear distortions. In particular, according to A. J. McGrath, M. B. Sandler, "Power digital to analogue conversion . . . , Electronic Letters, issue 31, No. 4, 1995, a constant pulse frequency is not ensured in the case of sigma-delta modulation.

Class-D amplifiers have in comparison with A, AB amplifiers a much lower power loss and are typically driven by PWM signals. It is known that digital pulse width modulators require a high time resolution of the PWM signal in order to minimize distortions caused by the time quantization. To date, a digital input signal is reduced with the aid of a multi-bit sigma-delta modulator in the amplitude resolution with, for example, 8 bits for a dynamic range greater than 80 dB and then the quantized signal with low resolution is fed to a pulse width modulator. On the one hand, as already mentioned, this requires a high clock frequency of more than 100 MHz on account of the relatively high time resolution of the pulse width signals (8 bits correspond to 256 different pulse widths), and on the other hand the pulse-width-modulated signal generated in this way is not free from non-linear distortions, since it is not the PWM signal but the amplitude-quantized signal that is fed back in the control loop, the two signals in the baseband, i.e. in the audio range of for example 0 to 20 kHz, not being completely identical. Therefore, the quantization noise is not optimally suppressed for the PWM signal by the control loop in the sigma-delta modulator.

Apart from great complexity of its circuitry, according to Jorge Varona, ECE University of Toronto, "Power Digital to Analog Conversion Using Sigma Delta and Pulse Width Modulations", a known method for digital PWM likewise requires a high operating clock frequency. In FIG. 6, a typical configuration for a digital pulse width modulator is represented. For the linearization of the PWM signal 15', the digital input signal 1 is extremely highly interpolated in an interpolation filter 10 and then limited in the amplitude resolution by means of a noise shaper 23 in the sigma-delta modulator. Since, however, the noise shaper 23 does not process the quantized PWM signal 15' but only the quantized amplitude signal before the pulse width modulation in a pulse width modulator 24, the actual quantization noise and the non-linearities of the time-quantized PWM signal 15' can only be suppressed sub-optimally. The digital PWM signal 15' is subsequently typically filtered in a post-filter 16, preferably after the amplification of the signal in an amplifier device (not represented).

SUMMARY OF THE INVENTION

It is therefore the object of the present invention to provide a device and a method for digital pulse width modulation by which a high linearity and low power loss are made possible in an amplifier device in the case of a large input signal bandwidth along with a reduction in the complexity of the circuitry.

According to the invention, this object is achieved by the device for digital pulse width modulation specified in Claim 1 and Claim 11 and by the method for digital pulse width modulation according to Claim 12.

The idea on which the present invention is based consists essentially in using the pulse-width-modulated signal as a feedback signal in a digital control loop and thereby linearizing it. Consequently, a modified sigma-delta modulator with multi-bit quantization is provided, the respective quantization stages being assigned corresponding pulse widths and these then serving as a feedback signal in the control loop.

In the present invention, the problem mentioned at the beginning is solved in particular by providing a device for digital pulse width modulation with: (a) a filter device for filtering a filter input signal; (b) a quantization device for quantizing a filter output signal of the filter device; (c) a PWM mapper device for generating a digital PWM signal from an output signal of the quantization device; and (d) a feedback loop for feeding back the digital PWM signal to a loop input signal for generating the filter input signal by subtraction.

In this way, a high linearity, and consequently as good as no distortions, is made possible even in the case of a low time resolution of the PWM signal for an audio signal, for example a pulse frequency of 350 kHz in the case of eight different pulse widths (3 bits). Moreover, a constant pulse frequency is guaranteed, so that no linear distortions occur in the case of asymmetrical pulses. For this reason, the present invention is suitable in particular for the generation of a PWM signal for Class-D amplifiers and, furthermore, on account of the relatively low pulse frequency, results in extremely small power losses in a downstream amplifier device or switch output stage. By contrast with the prior art, according to the present invention the digital PWM signal is processed directly in a modified noise shaper, which leads to high linearity of the digital PWM signal and in principle does not require any interpolation of the digital input signal.

Advantageous developments and improvements of the respective subject matter of the invention can be found in the subclaims.

According to a preferred development, a different sampling rate is provided at the filter device than the sampling rate of the quantization device.

According to a further preferred development, a pulse frequency of the PWM signal corresponds to the sampling frequency of the quantization device and is smaller by a factor of $2^N$ than the sampling frequency of the filter device, N corresponding to the number of bits of the quantization device.

According to a further preferred development, the PWM signal has a constant pulse frequency.

According to a preferred further development, amplitude values of the output signal of the quantization device can be converted into pulse widths of the PWM signal in the PWM mapper device.

According to a further preferred development, two at least similar feedback loops which are connected to each other on the output side via a load are provided, loop input signals that are inverse in relation to each other being provided on the two loops for generating a differential PWM signal at the load.

According to a further preferred development, provided downstream of the PWM mapper for amplification and/or filtering of the digital PWM signal there is an amplifier device and/or filter device, which is connected to a voltage supply which is likewise connected to an A/D converter, the output signal of which is connected to a multiplier in the control loop.

BRIEF DESCRIPTION OF THE DRAWINGS

Exemplary embodiments of the invention are explained in more detail in the description which follows and are represented in the drawings, in which:

FIG. 1 shows a schematic block diagram of a digital PWM device according to a first embodiment of the present invention;

FIG. 2 shows a schematic block diagram of a digital PWM device for explaining a second embodiment of the present invention;

DETAILED DESCRIPTION OF THE INVENTION

Figure 3:
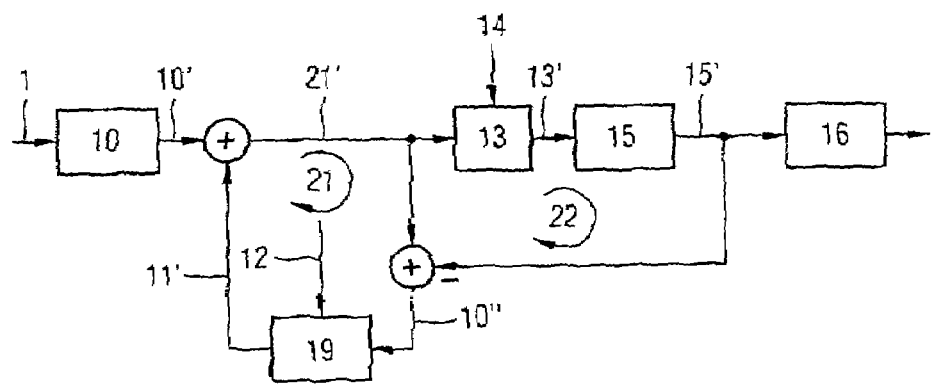
FIG. 3 shows a schematic block diagram of a digital PWM device for explaining a third embodiment of the present invention.

In the figures, the same reference numerals designate component parts that are the same or functionally the same.

Represented in FIG. 1 is a digital PWM device in which a digital input signal 1 is processed into a digital loop input signal 10', preferably in an interpolation device 10, such as for example an interpolation filter. Following a summation point +, a filter input signal 10" is fed to a filter device 11, for example a loop filter. The filter device 11 is operated with a filter sampling rate 12 and outputs a filter output signal 11', which is fed to a quantization device 13. A modified sigma-delta modulator is made up of the filter device 11 and the quantization device 13, the digital signal 11' being quantized in amplitude in the quantization device 13 at the output of the loop filter 11. The quantization device 13 is operated with an independent quantization sampling rate 14.

An output signal 13' of the quantization device 13 is subsequently converted by a PWM mapper device 15 into a digital PWM signal 15' with the time resolution which is obtained from the amplitude quantization by the quantization device 13. The PWM signal 15' generated in such a way is then fed back in the control loop 17 and subtracted from the loop input signal 10' at the summation point +, so that the filter input signal 10" is then generated. A post-filter device 16 preferably filters the digital PWM signal 15', the post-filter device 16 preferably being arranged downstream of an amplifier device (not represented). The optional interpolation device 10 according to FIG. 1 serves merely for simplifying the post-filter 16 downstream of the PWM, since, without interpolation, wide frequency spectra lie close to one another.

Since the various amplitude values of the output signal 13' of the quantization device 13 are converted into different pulse widths in the PWM mapper device 15, the filter device 11 operates with a different sampling rate 12 than the quantization device 13. The ratio of the sampling rate 12 of the filter device 11 and the sampling rate 14 of the quantization device 13 is obtained from the resolution of the PWM signal 15' as $2^N$=sampling rate 12/sampling rate 14, N corresponding to the number of bits of the quantization device 13 and $2^N$ corresponding to the number of possible pulse widths. From the sampling rate 14 of the quantization device 13 there is obtained the constant pulse frequency of the PWM signal 15', which is reduced by a factor of $2^N$ with respect to the sampling rate 12 of the filter device 11.

FIG. 2 shows an extended configuration in comparison with FIG. 1. Illustrated in FIG. 2 is the realization of the digital pulse width modulator according to FIG. 1 in a differential configuration. The differential embodiment of the digital PWM is essentially based on two similar single-ended embodiments according to FIG. 1, the input signals 1, −1, or the loop input signals 10', −10', respectively being inverted in relation to each other. The two single-ended strands are connected to each other downstream of the post-filter device 16 via a load 18.

Represented in FIG. 3 is a further embodiment for the digital pulse width modulation according to the present invention. A digital input signal 1 is likewise optionally fed to an interpolation device 10, preferably an interpolation filter, and a loop input signal 10' is formed. Following a summation point +, a loop signal 21' is provided and is applied to a quantization device 13. The quantization device 13 is operated with a sampling rate 14 and passes on a quantized output signal 13' to a PWM mapper device 15.

A digital PWM signal 15' generated in the PWM mapper device 15 according to FIG. 1 is on the one hand emitted to a post-filter device 16 and on the other hand subtracted in a feedback loop 22 from the loop signal 21' at a further summation point +, resulting in a filter input signal 10", which is subjected to a filtering in a filter device 19, which is operated with a filter sampling rate 12. A filter output signal 11' of the filter device 19 is added to the loop input signal 10' for generating the loop signal 21' of a further loop 21. According to FIG. 3, a realization of the control loop with an "error feedback" structure similar to in the case of sigma-delta modulators is illustrated, the filter device 19 being adapted to this structure.

Figure 4:
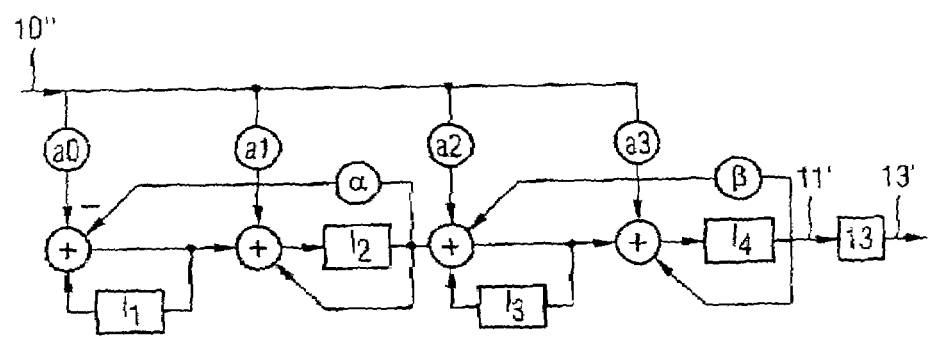
FIG. 4 shows a schematic block diagram of a filter device for explaining a detail of an embodiment of the present invention.

FIG. 4 shows an application-related implementation of a filter device 11, of the 4th order, which has four integrators I1, I2, I3 and I4. The filter input signal 10" is multiplied by coefficients a0, a1, a2, a3 and, according to FIG. 4, passed via the corresponding integrators I1 to I4 and also via additional factors α, β for generating the filter output signal 11'. This is followed by the quantization device 13 and the corresponding quantization output signal 13'. The loop filter according to FIG. 4 is provided with a quantization resolution of preferably 4 bits, it being optimized for an oversampling factor of 100. As an example, there is consequently obtained in the audio range for a filter sampling rate 12 of 8 MHz and 4 bits, which corresponds to 16 different pulse widths, a resolution of the PWM signal 15' of 80 dB SNR+THD single-ended according to FIG. 1 and of 93 dB SNR+THD in the case of a differential arrangement according to FIG. 2, the pulse frequency being 8 MHz/$2^N$=500 kHz.

Figure 5:
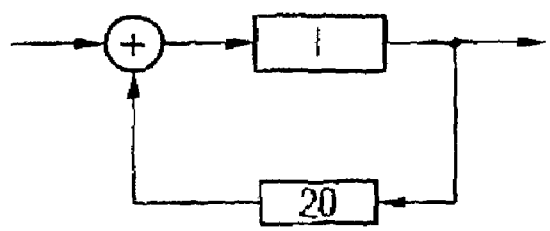
FIG. 5 shows a schematic block diagram for explaining a detail according to FIG. 4.
Figure 6:
FIG. 6 shows a schematic block diagram of a known digital PWM device.

For stabilization in the case of overloading of the filter device 11, the values in the integrators according to FIG. 5 can be limited by a limiting device 20. In addition, a reset can be carried out at the beginning of the PWM by a short sequence of 0s at the input of the control loop 17, 17', 21, 22.

Figure 7:
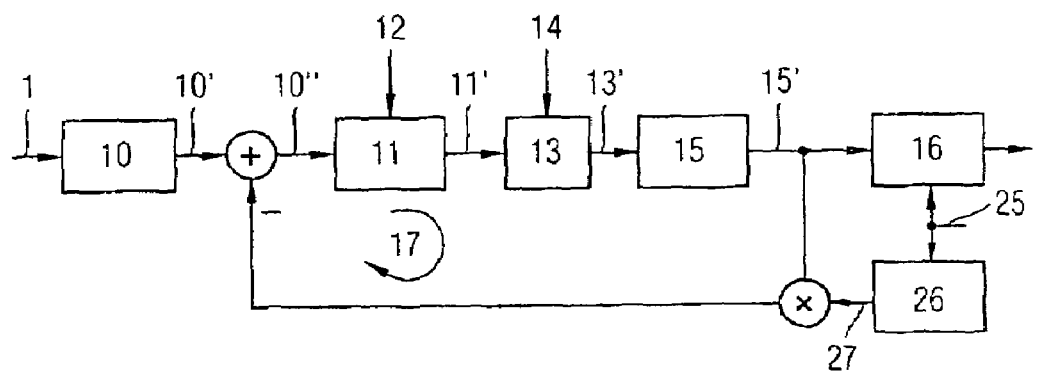
FIG. 7 shows a schematic block diagram of a digital PWM device for explaining a fourth embodiment of the present invention.

Represented in FIG. 7 is a further embodiment, which resembles the embodiment according to FIG. 1. The amplification device 16 is supplied with an operating voltage 25, which is likewise fed to an A/D converter 26. This digitized operating voltage 27 is then multiplied in a multiplying device X by the digital PWM signal 15', to also flow into the control loop 17.

Normal Class-D amplifiers on the other hand are essentially simple switching amplifiers, which, with a simple design, have no operating voltage suppression. Interferences on the operating voltage therefore directly influence the output signal and can lead to distortions and reduction of the weighted signal-to-noise ratio. According to this fourth embodiment, however, the interference voltage on the operating voltage is digitized. With the aid of this digitized interference signal 27, the output signal is then remodeled on the basis of the Class-D output stage 16 and fed in a correspondingly inverted form to the input of the pulse width modulator for compensation. Since the A/D converter 26 merely digitizes the interference voltage and consequently only influences the pulse amplitude of the digital feedback signal 15' of the control loop 17, but does not change the pulse edges of the feedback signal 15', the overall dynamic range is not limited by the A/D converter 26.

The A/D converter 26 can accordingly have a much lower resolution than the PWM modulator. In addition, the stability of the digital pulse width modulator is not influenced by the A/D converter 26. Generally occurring falsifications or distortions of the output signal of the switching amplifier 16 often result in interferences on the operating voltage 25. These interferences, i.e. this non-ideal amplification, are corrected according to the embodiment according to FIG. 7.

The effect of the amplifier device 16 can be described as multiplication of the digital PWM signal 15' by its operating voltage 25. The embodiment according to FIG. 7 is based on the simulation of the amplifier signal, in that the operating voltage 25 of the amplifier device 16 is digitally recorded, and the amplitudes of the PWM signals are multiplicatively modified in the feedback path 17 by the digitized operating voltage signal 27. An operating voltage interference or fluctuation occurring is then corrected by the feedback in the control loop 17. According to FIG. 7, after an optional interpolation in an interpolation device 10, the digital input signal 1 to be amplified is fed to a digital pulse width modulator that is modified in comparison with the embodiment according to FIG. 1. The PWM mapper 15 generates the corresponding PWM signals 15' from the roughly quantized PWM signals 13'.

The A/D converter 26 digitizes the operating voltage 25 of the amplification device 16 and multiplies it by the digital PWM signal 15', which consequently corresponds to the output signal of the switching amplifier (apart from the signal level). As a result, the digital pulse width modulator also records the interference on the operating voltage 25, so that this are [sic] consequently suppressed by the signal inversion in the control loop 17. Self-interferences caused by the switching operations of the amplification device 16 are also consequently recorded and correspondingly corrected. Since the loop gain for the self-interferences is chosen to be significantly less than 1, the control loop always remains stable, because the operating voltage 25 generally does not change in the same ratio as the voltage which drops across the load (not represented in FIG. 7). The resolution of the A/D converter 26 can be adapted to the dynamic range of the operating voltage 25, so that the resolution of the PWM signal is not limited by the converter resolution.

Figure 8:
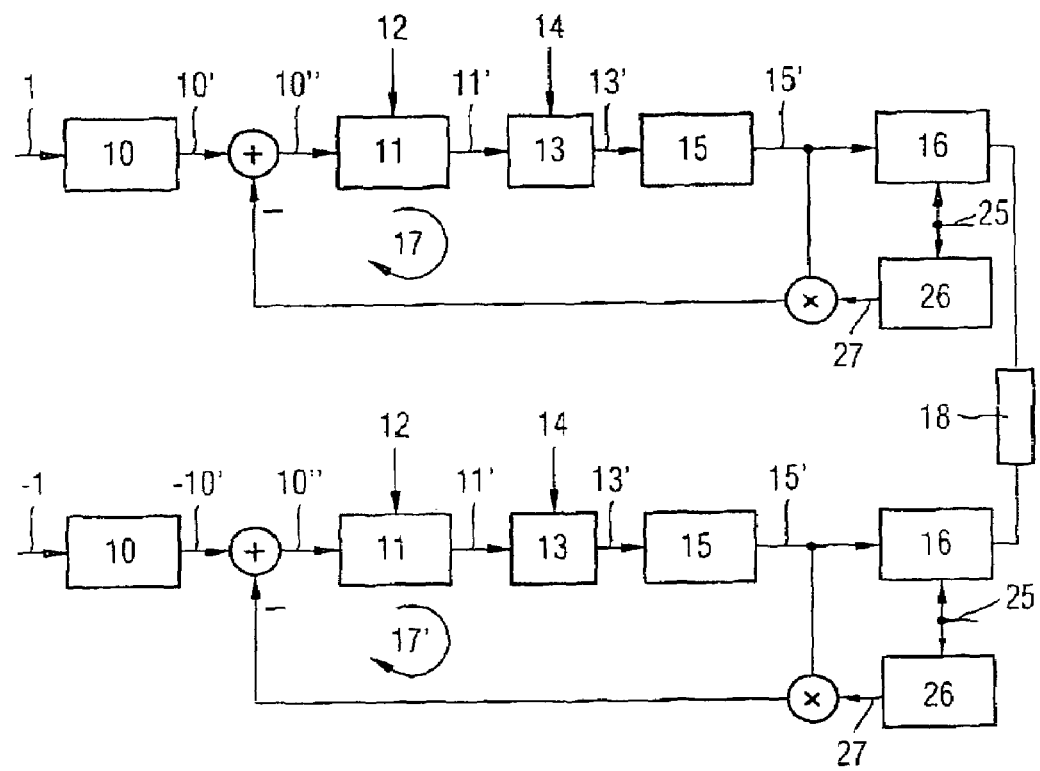
FIG. 8 shows a schematic block diagram of a digital PWM device for explaining a fifth embodiment of the present invention.

A fifth embodiment of the present invention, which resembles the embodiment according to FIG. 2, is represented in FIG. 8. The embodiment according to FIG. 8 likewise has the extension according to FIG. 7 with the analog-digital converter unit 26 for converting the operating voltage 25 into a digital signal 27, which is respectively coupled in via a multiplication device X in both strands 17, 17'. The behavior of this differential arrangement with two identical strands otherwise corresponds essentially to the embodiment according to FIG. 2. Since both amplification devices 16 are appropriately supplied with the same operating voltage, only one A/D converter 16 is required for both signal paths (not represented in FIG. 8.

With a purely differential design of the digital pulse width modulator according to FIG. 8 with subsequent Class-D amplification, the full system dynamic range is retained even with rough quantization of the operating voltage signal 25, since an interference is purely multiplicative. Therefore, the quantization noise of the A/D converter 26, for example with a zero signal at the input, is not also amplified. For an exact simulation of the PWM output signal amplitude, the ratio of the internal resistance of the operating voltage source 25 to the internal resistance of the amplifier 16 must be determined, in order to achieve amplitude simulation in the control loop that is as accurate as possible.

Figure 9:
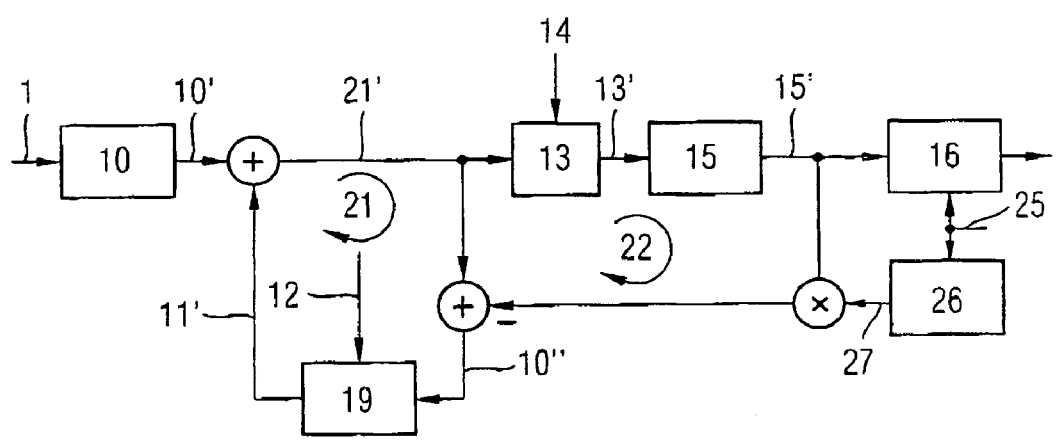
FIG. 9 shows a schematic block diagram of a digital PWM device for explaining a sixth embodiment of the present invention.

Represented in FIG. 9 is a sixth embodiment of the present invention, which is based on the embodiment according to FIG. 3. Here, too, the modification consists in the generation of a digitized signal 27, which is generated in the A/D converter 26 from the operating voltage 25 which is present at the amplifier device 16. This digitized operating voltage signal 27 is multiplicatively combined with the digitized PWM signal 15' in the control loop 22. With this "error feedback" structure according to FIG. 9, the loop filter 19 has a modified transfer function, as explained with respect to FIG. 3.

Although the present invention has been described above on the basis of several exemplary embodiments, it is not restricted to these but can be modified in various ways.

For example, in the case of dynamically distorted pulses of the PWM signal on account of the low number of pulse widths, a correction value can be introduced into the control loop with the aid of a look-up table, whereby a linear frequency spectrum of the digital pulse width modulator can be achieved even in the case of distortions that are extremely dependent on the pulse width in an amplifier device (not represented). Apart from this, a filter device of the 4th order, or 4 and 3 bits of the filter device and/or the quantization device, respectively, are to be regarded as given by way of example. According to the present invention, a bandpass PWM can also be easily realized.

The invention claimed is:
1. Device for digital pulse width modulation with:
   (a) a filter device for filtering a filter input signal;
   (b) a quantization device for quantizing a filter output signal of the filter device;
   (c) a PWM mapper device for generating a digital PWM signal from an output signal of the quantization device;
   (d) a feedback loop for feeding back the digital PWM signal to a loop input signal and for generating the filter input signal by subtraction; and
   (e) wherein a different sampling rate is provided at the filter device than the sampling rate of the quantization device.
2. Device according to claim 1, wherein an interpolation device, in particular an interpolation filter, is provided for generating the loop input signal from an input signal.
3. Device according to claim 1, wherein a post-filter device is provided for filtering the PWM signal.
4. Device according to claim 1, wherein a pulse frequency of the PWM signal corresponds to the sampling frequency of the quantization device and is smaller by a factor of $2^N$ than the sampling frequency of the filter device, N corresponding to the number of bits of the quantization device.
5. Device according to claim 1, wherein the PWM signal has a constant pulse frequency.
6. Device according to claim 1, wherein amplitude values of the output signal of the quantization device can be converted into pulse widths of the PWM signal in the PWM mapper device.
7. Device according to claim 1, wherein two at least similar feedback loops which are connected to each other on the output side via a load are provided, loop input signals that are inverse in relation to each other being provided on the two loops for generating a differential PWM signal at the load.
8. Device according to claim 1, wherein a loop filter of the 4th order with a resolution of the quantization device of 4 bits is provided as the filter device.
9. Device according to claim 1, wherein, for stabilization in the case of overloading, limiting devices are provided in the filter device for limiting output values of integrators.
10. Device for digital pulse width modulation with:
   (a) a filter device for filtering a filter input signal in a first feedback loop;
   (b) a quantization device for quantizing a loop signal;
   (c) a PWM mapper device for generating a digital PWM signal from an output signal of the quantization device;
   (d) a second feedback loop for feeding back the digital PWM signal to a loop signal while generating the filter input signal by subtraction, it being possible for the loop signal to be generated from a loop input signal and a filter output signal by addition; and
   (e) wherein a different sampling rate is provided at the filter device than the sampling rate of the quantization device.
11. Device according to claim 1, wherein an amplifier device and/or filter device is provided downstream of the PWM mapper for amplification and/or filtering of the digital PWM signal and is connected to a voltage supply which is likewise connected to an A/D converter, the output signal of which is connected to a multiplier in the control loop.
12. Method for digital pulse width modulation with the steps of:
   (a) filtering a filter input signal in a filter device having a first sampling rate;
   (b) quantizing a filter output signal of the filter device in a quantization device having a second sampling rate being different from the first sampling rate;
   (c) generating a digital PWM signal from the output signal of the quantization device in a PWM mapper device; and
   (d) feeding back the digital PWM signal to a loop input signal and generating the filter input signal in a feedback loop.
13. Method according to claim 12, wherein a bandpass pulse width modulation is performed.
14. Method according to claim 12, wherein an amplifier device and/or filter device is provided downstream of the PWM mapper for amplification and/or filtering of the digital PWM signal and is connected to a voltage supply which is likewise connected to an A/D converter, the output signal of which is connected to a multiplier in the control loop, the operating voltage signal being digitized in the A/D converter and coupled into the control loop.

* * * * *